United States Patent
Liang et al.

(10) Patent No.: US 10,381,584 B2
(45) Date of Patent: Aug. 13, 2019

(54) CARBON NANOTUBE THIN FILM TRANSISTOR AND MANUFACTURING METHOD THEREOF

(71) Applicants: BOE TECHNOLOGY GROUP CO., LTD., Beijing (CN); PEKING UNIVERSITY, Beijing (CN)

(72) Inventors: Xuelei Liang, Beijing (CN); Guanbao Hui, Beijing (CN); Boyuan Tian, Beijing (CN); Fangzhen Zhang, Beijing (CN); Haiyan Zhao, Beijing (CN); Jiye Xia, Beijing (CN); Qiuping Yan, Beijing (CN); Lianmao Peng, Beijing (CN)

(73) Assignees: BOE TECHNOLOGY GROUP CO., LTD., Beijing (CN); PEKING UNIVERSITY, Beijing (CN)

( * ) Notice: Subject to any disclaimer, the term of this patent is extended or adjusted under 35 U.S.C. 154(b) by 0 days.

(21) Appl. No.: 15/520,069

(22) PCT Filed: Aug. 17, 2016

(86) PCT No.: PCT/CN2016/095616
§ 371 (c)(1),
(2) Date: Apr. 18, 2017

(87) PCT Pub. No.: WO2017/148107
PCT Pub. Date: Sep. 8, 2017

(65) Prior Publication Data
US 2018/0358569 A1 Dec. 13, 2018

(30) Foreign Application Priority Data

Mar. 1, 2016 (CN) .......................... 2016 1 0115033

(51) Int. Cl.
*H01L 51/05* (2006.01)
*H01L 29/43* (2006.01)
(Continued)

(52) U.S. Cl.
CPC ...... *H01L 51/0558* (2013.01); *H01L 29/0673* (2013.01); *H01L 29/43* (2013.01);
(Continued)

(58) Field of Classification Search
CPC ............. H01L 51/0558; H01L 51/0003; H01L 51/0023; H01L 51/0048; H01L 51/0545; H01L 51/055
See application file for complete search history.

(56) References Cited

U.S. PATENT DOCUMENTS

2008/0157061 A1* 7/2008 Karna .................... B82Y 10/00
257/24
2011/0136304 A1* 6/2011 Wong ..................... B82Y 10/00
438/167
(Continued)

FOREIGN PATENT DOCUMENTS

| CN | 103367556 A | 10/2013 |
|---|---|---|
| CN | 203674269 U | 6/2014 |
| JP | 2006245371 A | 9/2006 |

OTHER PUBLICATIONS

International Search Report and Written Opinion dated Nov. 23, 2016 in PCT/CN2016/095616.
(Continued)

*Primary Examiner* — Fernando L Toledo
*Assistant Examiner* — Neil R Prasad
(74) *Attorney, Agent, or Firm* — Syncoda LLC; Feng Ma

(57) ABSTRACT

The present disclosure provides a carbon nanotube thin film transistor (CNT-TFT) and its manufacturing method. The carbon nanotube thin film transistor includes a source elec-
(Continued)

trode, a drain electrode, a channel region, a plurality of protrusions, and a carbon nanotube layer. The channel region is between the source electrode and the drain electrode. The plurality of protrusions are at, and extend in a length direction of, the channel region. The carbon nanotube layer is disposed over the plurality of protrusions, and comprises a plurality of carbon nanotubes.

20 Claims, 3 Drawing Sheets

(51) Int. Cl.
      *H01L 29/786* (2006.01)
      *H01L 51/00* (2006.01)
      *H01L 29/06* (2006.01)

(52) U.S. Cl.
      CPC ........ *H01L 29/786* (2013.01); *H01L 51/0003* (2013.01); *H01L 51/0023* (2013.01); *H01L 51/0048* (2013.01); *H01L 51/055* (2013.01); *H01L 51/0545* (2013.01)

(56) References Cited

U.S. PATENT DOCUMENTS

2012/0028820 A1* 2/2012 Rhodes .................. B82Y 15/00
                                                                  506/9
2013/0260093 A1 10/2013 Wei

OTHER PUBLICATIONS

1st Office Action dated Jan. 29, 2018 in CN201610115033.X.
Chinese Office Action dated Sep. 25, 2018 in corresponding Chinese application No. 201610115033.X.
Zhao, Qing-Liang, et al., Photoelectric Characteristics of Self-Assembled Smiconducting Carbon Nanotube Thin Films, Acta Phys.-Chim. Sin. 2014, 30(7) 1377-1383 May 9, 2014.
3rd Chinese Office Action dated Dec. 24, 2018 in corresponding Chinese application No. 201610115033.X.
Hongsik Park, et al., "High-density integration of carbon nanotubes via chemical self-assembly," Nature Nanotechnology, vol. 7, 787-791.

\* cited by examiner

| Forming a plurality of strip-shaped and intervally arranged protrusions at a channel region between source electrode and drain electrode, wherein the plurality of protrusions are aligned successively along a width direction of the channel region, and extend in a length direction of the channel region | S302 |

↓

| Forming a carbon nanotube layer over the plurality of protrusions and the intervals between neighboring protrusions | S304 |

FIG. 3

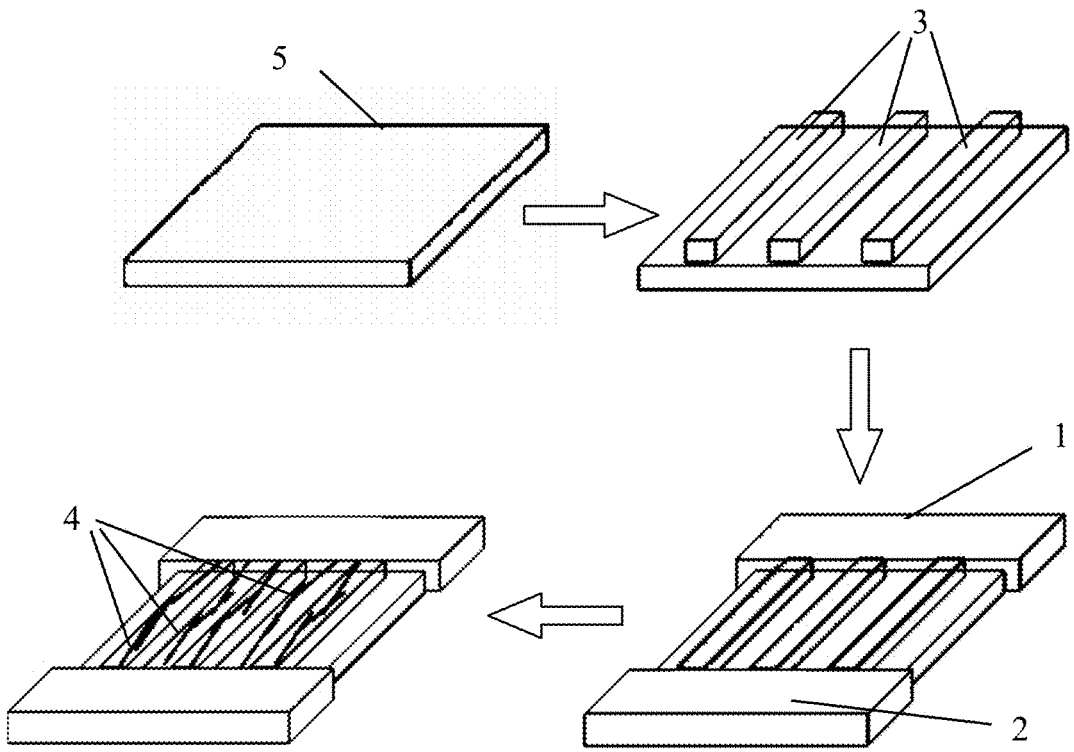

FIG. 4

CARBON NANOTUBE THIN FILM TRANSISTOR AND MANUFACTURING METHOD THEREOF

CROSS-REFERENCE TO RELATED APPLICATION

The present application claims priority to Chinese Patent Application No. 201610115033.X filed on Mar. 1, 2016, the disclosure of which is hereby incorporated by reference in its entirety.

TECHNICAL FIELD

The present disclosure relates generally to display technologies, and more specifically to a carbon nanotube thin film transistor and its manufacturing method.

BACKGROUND

Carbon nanotubes are considered one of the most promising materials of the post-Moore's law era because of its excellent electrical properties and stability. The intrinsic carbon nanotube is around ⅔ of semi-conducting nature and ⅓ of metallic nature, and the range of application of nanotubes as a transistor channel material is limited due to their metallic nature.

In recent years, mesh-like carbon nanotube thin film transistors manufactured based on solution separation and purification technology has drawn more and more attention. This is because carbon nanotubes with as high as 99%-99.9% of semi-conductive nature can be manufactured through the solution separation and purification technology. Furthermore, the charge carriers need to be transmitted from the source electrode to the drain electrode through a plurality of carbon nanotubes in the carbon nanotube thin film transistor mesh, and as such, the negative impacts of the metallic nature of carbon nanotubes on the current on-off ratios (or current switching ratios) can be overcome.

However, as shown in FIG. 1, which illustrates an electron microscope image of the distribution of carbon nanotubes in the channel of existing thin film transistor, the distribution of carbon nanotubes in the carbon nanotube mesh is generally unordered. As such, the number of nodes over the channel between the source electrode and the drain electrode is large, the node resistance is large, and as a result, the on-state current and the carrier mobility are relatively small.

It can be appreciated, although the performance of the mesh-like carbon nanotube transistor is better than amorphous silicon and organic thin film materials, there is still a large distance from the intrinsic performance of the carbon nanotube. Therefore, how to improve the performance of the mesh-like carbon nanotube thin film transistors is an urgent problem waiting to be solved.

SUMMARY

The main purpose of the present disclosure is to provide a technical solution to make the distribution of the carbon nanotube mesh to be more orderly and therefore reduce the number of nodes between the source electrode and the drain electrode and improve the performance of the carbon nanotube thin film transistor mesh.

In order to achieve the aforementioned purpose, in one aspect of the present disclosure, a carbon nanotube thin film transistor is provided. The carbon nanotube thin film transistor includes: a source electrode, a drain electrode, a channel region, a plurality of protrusions, and a carbon nanotube layer. The channel region is between the source electrode and the drain electrode. The plurality of protrusions are at, and extend in a length direction of, the channel region. The carbon nanotube layer is disposed over the plurality of protrusions, and includes a plurality of carbon nanotubes.

Herein the length direction of the channel region is defined as the source-drain direction, i.e. the direction from the source electrode to the drain electrode or from the drain electrode to the source electrode. A width direction of the channel region is defined as the direction that is perpendicular to the length direction.

In some embodiments of the carbon nanotube thin film transistor, the plurality of carbon nanotubes in the carbon nanotube layer are in substantially a same direction as the length direction of the channel region.

In some embodiments of the carbon nanotube thin film transistor, the plurality of protrusions are arranged in strips, aligning along a width direction of the channel region and with an interval between every two neighboring protrusions. Each of the plurality of protrusions can be cuboid, and can be of other shapes.

The height of each of the plurality of protrusions can be substantially same, and can be ranged 10 nm-1000 nm.

A first width of an interval between every two neighboring protrusions can be substantially same, can be smaller than an average length of the plurality of carbon nanotubes in the carbon nanotube layer, and can be ranged 5 nm-2000 nm.

A second width of each of the plurality of protrusions can be smaller than the average length of the plurality of carbon nanotubes in the carbon nanotube layer.

In some embodiments, the carbon nanotube thin film transistor can further comprise a gate electrode and a gate electrode insulating layer. The gate electrode insulating layer is between the gate electrode and the carbon nanotube layer.

The plurality of protrusions can be disposed over the gate electrode, and can comprise a same material as, and form an integrated structure with, the gate electrode. Alternatively, the plurality of protrusions can be disposed over the gate electrode insulating layer, can can comprise a same material as, and form an integrated structure with, the gate electrode insulating layer.

In another aspect, the present disclosure provides a method for fabricating a carbon nanotube thin film transistor. The method can comprise the following steps:

Providing a substrate;

Forming a gate electrode and a gate electrode insulating layer over the substrate; and Forming a carbon nanotube layer, a pattern of a channel region, a source electrode, and a drain electrode.

In the above method disclosed herein, the channel region is between the source electrode and the drain electrode; a plurality of protrusions is arranged at the channel region and extend in a length direction of the channel region; and the carbon nanotube layer comprises a plurality of carbon nanotubes, and is disposed over the plurality of protrusions.

In some embodiments of the method, forming a gate electrode and a gate electrode insulating layer over the substrate can comprise the following sub-steps:

Forming the gate electrode and the plurality of protrusions over the substrate, wherein the plurality of protrusions are disposed over, comprise a same material as, and form an integrated structure with, the gate electrode; and Forming the gate electrode insulating layer over the gate electrode and the plurality of protrusions.

In some other embodiments of the method, forming a gate electrode and a gate electrode insulating layer over the substrate can comprise the following sub-steps:

Forming the gate electrode over the substrate; and

Forming the gate electrode insulating layer and the plurality of protrusions, wherein the plurality of protrusions are disposed over, comprise a same material as, and form an integrated structure with, the gate electrode insulating layer.

In some embodiments of the method, forming a carbon nanotube layer, a pattern of a channel region, a source electrode, and a drain electrode can comprise the following sub-steps:

Forming the carbon nanotube layer and forming the pattern of the channel region; and Forming the source electrode and the drain electrode.

In some other embodiments of the method, forming a carbon nanotube layer, a pattern of a channel region, a source electrode, and a drain electrode can comprise the following sub-steps:

Forming the source electrode and the drain electrode; and

Forming the carbon nanotube layer and forming the pattern of the channel region.

In any of the above described embodiment of the method, the plurality of protrusions can be formed through coating and photolithographic etching, but can also be formed through halftone etching, there is no limitation herein. The carbon nanotube layer can be formed by depositing a carbon nanotube solution.

Compared with existing technologies, the carbon nanotube thin film transistor and its manufacturing method provided by embodiments of the present disclosure can ensure the distribution of the carbon nanotube mesh in the thin film transistors more orderly, and therefore the number of nodes between the source electrodes and the drain electrodes is reduced and the node resistance is reduced, and therefore the off-state current and the charge carrier mobility are improved, and therefore the performance of the carbon nanotube thin film transistor mesh is improved.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

FIG. 3 is a flow chart illustrating the manufacturing process of the carbon nanotube thin film transistor according to some embodiments of the present disclosure;

FIG. 4 is a flow chart illustrating the manufacturing process of the carbon nanotube thin film transistor according to some embodiments of the present disclosure.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

For existing carbon nanotube thin film transistors, the carbon nanotubes are not distributed orderly, i.e., the carbon nanotubes are distributed along all directions and the distribution is not orderly, which causes presence of multiple intersecting nodes of carbon nanotubes, in turn increasing the resistance between the source electrodes and the drain electrodes, and ultimately leading to reduced on-state currents, reduced carrier mobility, and reduced performance of the carbon nanotube thin film transistor.

The present disclosure provides an improvement by ordering the distribution directions of carbon nanotubes, which allows the carbon nanotubes to be distributed substantially along the length direction of a channel region between the source electrode and the drain electrode (or the source-drain direction), i.e., the distribution direction of carbon nanotubes is substantially parallel to the length direction of the channel region between the source electrode and the drain electrode (the source-drain direction). As such, the number of intersecting nodes of carbon nanotubes can thereby be maximally reduced.

Figure 1:
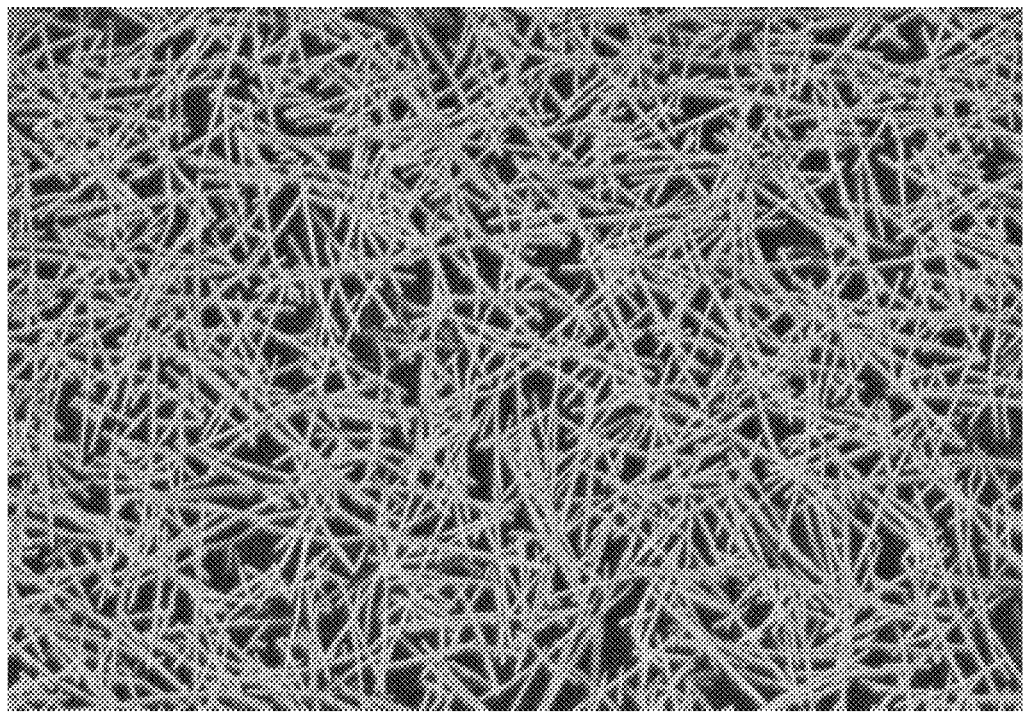
FIG. 1 is an electron microscope image of the distribution of the carbon nanotubes in the channels of the thin film transistors in prior art.
Figure 2:
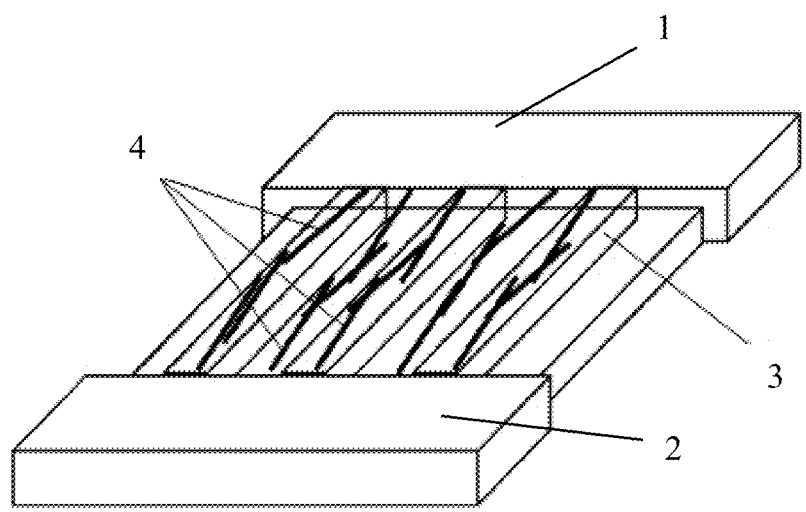
FIG. 2 is a structural diagram of a carbon nanotube thin film transistor according to some embodiments of the present disclosure.

In one aspect, the present disclosure provides a carbon nanotube thin film transistor, as shown in FIG. 2. The carbon nanotube thin film transistor includes a source electrode 1 and a drain electrode 2. A plurality of strip-shaped protrusions 3 are intervally arranged in a channel region between the source electrode and drain electrode.

The plurality of protrusions 3 are successively arranged along the width direction of the channel region, and are configured to extend along the length direction of the channel. The carbon nanotube thin film transistor further includes a carbon nanotube layer, which comprises a plurality of carbon nanotubes 4 and is disposed over the plurality of protrusions 3 and intervals between neighboring protrusions.

Because the plurality of intervally arranged protrusions are disposed at the channel region of the carbon nanotube thin film transistor, in the process of forming the carbon nanotube layer, the direction of the distribution of the carbon nanotubes will be constrained by the protrusions.

Because of the grooves formed at the intervals between every two neighboring protrusions, carbon nanotubes are less likely to be arranged along the horizontal direction (i.e., a direction perpendicular to the length direction of the channel region between the source electrode and the drain electrode, or the source-drain direction), and most carbon nanotubes are constrained into the grooves and are thus distributed along the extending direction of the protrusions (i.e., a direction parallel to the length direction of the channel region between the source electrode and the drain electrode).

Over the surface of each protrusion, because the width of the protrusion is limited, the surface tension also has certain degree of constraining effects on the formation of carbon nanotubes over each of the protrusions.

As such, the carbon nanotubes are preferentially distributed along the length direction of the channel region between the source electrode and the drain electrode (i.e. the source-drain direction), regardless in the grooves or over the surfaces of the protrusions.

In some embodiments, the plurality of protrusions comprise a plurality of cuboids parallel to one another, as illustrated in FIG. 2.

As shown in FIG. 2, the height of each protrusion can be the same. The protrusions with the same heights can ensure that the carbon nanotubes in the carbon nanotube layer have similar lengths and have more even distribution. In some other embodiments, the height of each protrusion can be different.

Herein, because the plurality of protrusions serve to prevent the carbon nanotubes from being distributed at a direction perpendicular to the length direction of the channel region between the source electrode and the drain electrode, in order for most carbon nanotubes to be distributed along a direction parallel to the length direction of the channel region between the source electrode and the drain electrode (i.e. the source-drain direction), or to reduce the angles between the distribution direction of the carbon nanotubes and the source-drain direction, preferably the height of the protrusions can be selected in a range between 10 nm-1000 nm.

In some embodiments, the distances between every two protrusions are the same, as shown in FIG. 2, where the distances between all protrusions are the same (i.e. the widths of the grooves between the protrusions are the same). In the carbon nanotube layer formed over all protrusions, the distribution of the carbon nanotubes at the intervals between every two protrusions is similarly even, which improves the uniformity of the whole carbon nanotube layer.

In order to better constrain the distribution direction of the carbon nanotubes, the distance between two neighboring protrusions can be set as smaller than the average length of the carbon nanotubes in the carbon nanotube layer in some embodiments of the disclosure. Currently the difference in the lengths of carbon nanotubes is relatively large, thus in order to maximally constrain the distribution directions of most carbon nanotubes to the direction roughly parallel to the source-drain direction, the average length of the carbon nanotubes can be employed as a reference length.

If the distance between protrusions is smaller than the reference length, the distribution directions of most carbon nanotubes can be constrained to be roughly parallel to the source-drain direction. As such, the distance between each neighboring protrusions can be ranged between 5 nm-2000 nm.

Similarly, in order to better constrain the distribution direction of the carbon nanotubes, the width of each protrusion can be set as smaller than the average length of carbon nanotubes in the carbon nanotube layer, which can constrain the distribution direction of most carbon nanotubes to be roughly parallel to the source-drain direction. The width of each protrusion can be the same, or can be different.

The carbon nanotube thin film transistor as disclosed herein further includes a gate electrode and a gate electrode insulating layer. The gate electrode insulating layer is disposed between the gate electrode and the carbon nanotube layer.

The present disclosure provides two configurations of the plurality of protrusions, and two fabrication methods thereof:

(1) The plurality of protrusions can be disposed on the gate electrode, which can comprise a same material as the gate electrode and can be integrally formed with the gate electrode. In this configuration, the plurality of protrusions can be fabricated over an existing planar gate electrode directly, and the integrated gate electrode and protrusions can be fabricated by coating and photolithographic etching.

(2) The plurality of protrusions can be disposed on the gate electrode insulating layer, which can comprise a same material as the gate electrode insulating layer and can be integrally formed with the gate electrode insulating layer. In this configuration, an existing planar gate electrode can still be employed, and the plurality of protrusions can be formed integrally with the gate electrode insulating layer when the gate electrode insulating layer is fabricated over the planar gate electrode.

It should be noted that the plurality of protrusions according to either (1) or (2) can be manufactured conveniently.

The present disclosure further provide a method for fabricating the carbon nanotube thin film transistor as described above. As shown in FIG. 3, the method comprises the following steps:

Step S302: Forming a plurality of strip-shaped and intervally arranged protrusions at a channel region between source electrode and drain electrode, wherein the plurality of protrusions are aligned successively along a width direction of the channel region, and extend in a length direction of the channel region; and Step S304: Forming a carbon nanotube layer over the plurality of protrusions and the intervals between neighboring protrusions.

During the process of forming the carbon nanotube thin film transistor, a gate electrode also needs to be formed, and a gate electrode insulating layer needs to be formed between the gate electrode and the carbon nanotube layer. As such, in the manufacturing method of the carbon nanotube thin film transistor disclosed herein, the following two methods can be adopted for the formation process of the plurality of protrusions:

(a) Forming a gate electrode and a plurality of protrusions integrally with a same material, followed by forming a gate electrode insulating layer over the gate electrodes and the plurality of protrusions. That is, the plurality of protrusions can be fabricated over an existing planar gate electrode directly, and the integrated gate electrode and protrusions can be fabricated by coating and photolithographic etching.

(b) Forming a gate electrode, then forming a gate electrode insulating layer and the plurality of protrusions integrally over the gate electrode. That is, an existing planar gate electrode can still be employed in this method, and the plurality of protrusions can be formed integrally with the gate electrode insulating layer when the gate electrode insulating layer is fabricated over the planar gate electrode.

None of the above-described methods increases the complexity of the fabrication process.

Figure 5:
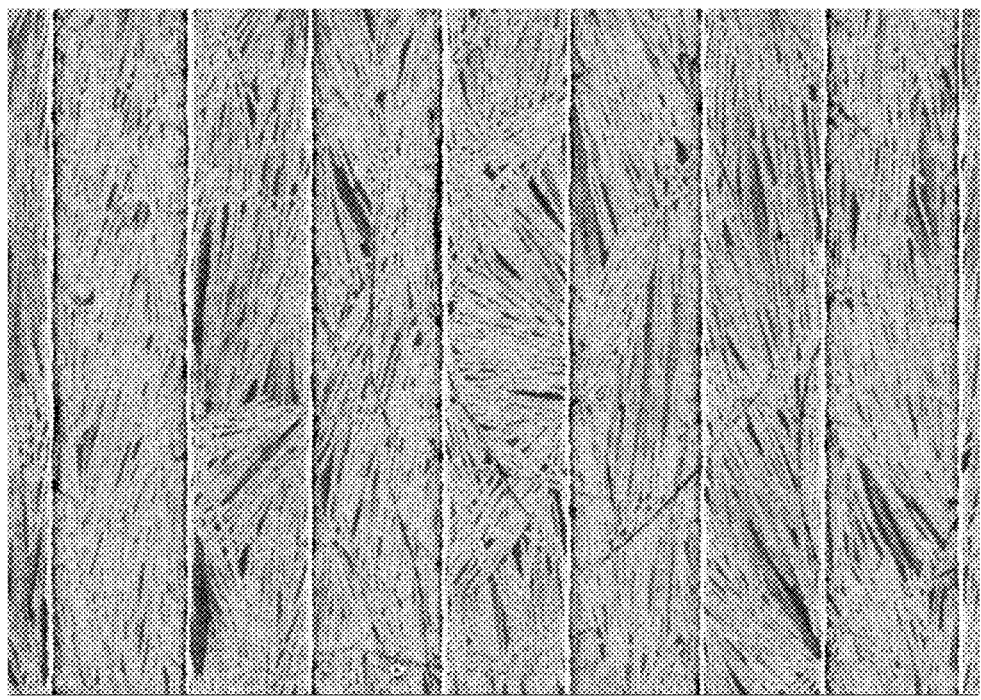
FIG. 5 is an electron microscope image of the distribution of the carbon nanotubes in the channels of the thin film transistor according to some embodiments of the present disclosure.

More detailed description of the manufacturing process of the carbon nanotube thin film transistor is provided by FIG. 4 and FIG. 5.

FIG. 4 is a flow chart illustrating major steps of the manufacturing process of the carbon nanotube thin film transistor according to some embodiments of the present disclosure. With reference to FIG. 4, the carbon nanotube thin film transistor can be manufactured through the following steps:

(1) Preparing an alignment mark over a substrate 5, and optionally, in order to achieve better results, cleaning the surface of the substrate in advance. Cleaning can be ozone cleaning, ultrasonic cleaning, surfactant cleaning, or aqueous ammonia+hydrogen peroxide solution cleaning, etc. In order to increase the absorbability between the substrate and the thin film, the surface of the substrate can further be chemically modified.

In practice, the following treatments can be conducted to the surface of the substrate. The substrate sheets used for preparing the substrate can be cleaned by a dry method or by a wet method. As for the dry method, the substrate sheets can be cleaned by ozone or oxygen-plasma; and as for the wet method, the substrate sheets can be cleaned by an acid (sulfuric acid, nitric acid, etc.), an organic solvent (acetone, ethanol, NMP, etc.), or RCA-SC1 (aqueous ammonia+hydrogen peroxide).

(2) Preparing a lower portion of the gate electrode (i.e., the bottom portion of the gate electrode before the protrusions are formed) through coating and photolithographic etching.

Specifically, the pattern of the lower portion of the gate electrode can be first prepared over the substrate by photolithographic etching. Because the lower portion of the gate electrode is the same as the gate electrode of a common bottom-gate transistor, a same photolithographic etching mask can be employed. As such, the pattern of the lower portion of the bottom gate electrode can be prepared by the method of coating+photolithographic etching+etching or the method of photolithographic etching+coating+lifting-off. The material of the gate electrode can be a metal (e.g. aluminum, cupper, gold, etc.), a conductive glass (e.g. ITO), or an organic conductive compound.

(3) Preparing an upper portion of the gate electrode (i.e. the protrusions 3) through coating and photolithographic etching on the lower portion of the gate electrode, to thereby form the gate electrode with protrusions 3 over the substrate.

Specifically, a strip-shaped pattern with a thickness (i.e. a plurality of protrusions 3) can be formed along the source-drain direction by coating and photolithographic etching. Alternatively, the plurality of protrusions can be formed along the source-drain direction by halftone etching. Through these processing steps, the plurality of protrusions 3 and the lower portion of the gate electrode together form an indentation-protrusion structure (i.e. the above-described protrusions and the planar surface between the protrusions).

To achieve a better distribution direction of the carbon nanotubes, the widths of the strips (the widths of the protrusions) and the distance between the strips (the width of the grooves between protrusions) need to be carefully selected based on the different needs of different carbon nanotubes and different devices.

Meanwhile, the height of the protrusions also has impacts on the appearance of the carbon nanotubes; if the height is too small, the deposition of carbon nanotubes at the direction perpendicular to the strips will not be constrained, and the directing effect will not be achieved. As such, the thickness of the coating also needs to be adjusted depending on needs.

For example, for carbon nanotubes having an average length of 1.4 µm, a good carbon nanotube distribution can be achieved at a strip width (i.e., the width of the protrusion) of 750 nm, at a strip distance (i.e., the distance between the protrusions) of 750 nm, and at a coating thickness (i.e., the height of the protrusion) of 200 nm.

The material of the gate electrode can be a metal, a conductive glass, a heavily doped semiconductor, or an organic conductive compound. As described above, the upper portion and the lower portion of the gate electrode can employ a same gate electrode material, which benefits the formation process and simplifies the whole fabrication process.

Additionally, the plurality of protrusions 3 can be straight-shaped, wave-shaped, or take other shapes, as long as the direction is roughly parallel to the length direction of the channel region between the source electrode and the drain electrode (i.e. the source-drain direction).

It should be noted that, because carbon nanotubes distributed along the length direction of the channel region between the source electrode and the drain electrode (i.e. the direction of the electric current) are to be prepared, the strips parallel to the length direction of the channel region between the source electrode and the drain electrode can be employed as the top portion of the gate electrode.

As such, the widths and distances between strips correspond to the width of the whole protrusions and the indentations between protrusions, and as long as any of the widths and the distances are smaller than the lengths of the carbon nanotubes, it will have positive impacts on the distribution of the carbon nanotubes along the direction of the lengths of the channel region between the source electrode and the drain electrode. By adjusting the widths and the distances, carbon nanotubes with different orientations can be obtained. The height of the protrusions is one factor that prevents the carbon nanotubes to distribute along the direction wanted, and in practice, it shall be selected based on the parameters needed by the transistor and the processing conditions.

(4) Forming the gate insulating layer over the gate electrode with the protrusions by atomic layer deposition (ALD).

The gate insulating layer can be an oxide dielectric layer, or an organic dielectric layer. In practice, the gate insulating layer can be hafnium oxide or aluminum oxide, and the photolithographic etching mask used for common carbon tube transistors can also be used herein.

(5) Depositing a carbon nanotube thin film (or layer) comprising a plurality of carbon nanotubes 4 over the gate insulating layer, and forming a pattern of the channel region (i.e., the regions between the source electrodes and the drain electrodes) by photolithographic etching.

A carbon nanotube solution needs to be prepared for this purpose. For example, it can be prepared by dispersing carbon nanotube powder into a suitable solvent through ultrasonic, blending, and microwave. The solvent can be water, o-Xylene, chloroform, or N-Methyl-2-pyrrolidone, etc. During dispersion, a surfactant, such as sodium dodecyl sulfate, sodium dodecyl benzene sulfonate, diazo salt, enzymes, DNA can be added to prepare uniform and stable thin films.

Before depositing, the carbon nanotubes can be cleaned or modified based on needs. The cleaning process is similar as mentioned above; for the modification process, self-assembled molecules such as APTES, poly-lysine can be employed. Generally, the carbon nanotube thin film is prepared by immersing a substrate into the carbon nanotube solution and let it stay and deposit for a certain period of time.

After the substrate is taken out, it is heat-treated to remove the remaining solution and to harden the film. Heat treatment for the substrate after depositing the carbon nanotube thin film can include methods using light, microwave, water bath, or oven.

After the carbon nanotube layer is formed, the channel region can be packaged (i.e. packaging over the carbon nanotube layer formed). The packaging method is the same as that for common transistors, and can include PE-CVD technology, involving packaging with silicon nitride and silicon dioxide, or ALD technology, involving packaging with oxides or organic materials such as epoxy.

(6) Forming the source electrode 1 and the drain electrode 2 by coating and photolithographic etching.

Specifically, the source electrode 1 and the drain electrode 2 can be a metal, a conductive glass, a heavily-doped semiconductor, an organic conductive compound. In other words, the same electrode material can be employed for the source electrode, the drain electrode, and the gate electrode.

It should be noted that step (5) and step (6) can be interchanged, that is, the source electrode and the drain electrode can be formed before depositing the carbon nanotube thin film and the pattern of the channel.

FIG. 5 is an electron microscope diagram of the distribution of the carbon nanotubes in the thin film transistor channel according to some embodiments of the present disclosure. As can be seen in FIG. 5, the carbon nanotube thin film transistor with this type of protrusions can ensure most of the carbon nanotubes formed to distribute along, or of a relatively small angle to, the length direction of the channel region between the source electrode and the drain electrode (source-drian direction), the number of carbon nanotube nodes (nodes) between the source electrode and the drain electrode is thus reduced. As a result, the performance parameters of the carbon nanotube thin film transistor such as the on-state current and the carrier mobility rate can be improved.

The beneficial effects of the embodiments of the present disclosure are as follows:

Because the carbon nanotube thin film formed has a distribution direction along the length direction of the channel region between the source electrode and the drain electrode (i.e., source-drain direction), the number of nodes in the carbon nanotube mesh is reduced and the node resistance is reduced, therefore the on-state current and carrier mobility rate can be increased for several folds.

The height of the protrusions also increases the cross-section width of the carbon nanotube thin film transistor, thus the area of the conductive path is increased, which is also beneficial for increasing the on-state current and the carrier mobility rate;

This specially-structured gate electrode has a higher coverage rate of the carbon nanotubes than that of the planar gate electrode, thus the adjustment efficiency is higher, which is beneficial for performance parameters such as subthreshold slope and on-off ratio;

Compared with common carbon nanotube transistors, there is no need to add new devices, new equipments, new processes, or specific labor; the method is compatible with existing processes, and only a photolithographic etching mask needs to be additionally fabricated, therefore it does not increase the complexity of the process.

As such, this specially-structured transistor having protrusions is suitable for thin film transistor that comprises carbon nanotube in the gate electrode. Compared with silicon or other materials, carbon nanotubes can be more easily fabricated into a three-dimensional (3D) structured thin film. This type of 3D-structured gate electrode is easier to manufacture compared with methods such as dry etching over silicon substrate, which requires only one additional coating step during fabrication of the protrusions. Furthermore, the ALD method for growing gate insulating layer is also compatible to this structure.

In the embodiments of the present disclosure, by fabricating protrusions that have certain heights, widths, and gaps that are arranged along the direction of the length of the channel regions between the source electrodes and the drain electrodes (or the source-drain direction), most of the carbon nanotubes distribute with a relatively small angles along the source-drain direction, the number of carbon nanotube nodes between the source electrode and the drain electrode is therefore reduced, and the performance parameters of the carbon nanotube thin film transistor such as the on-state current, carrier mobility and subthreshold slope are improved.

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A carbon nanotube thin film transistor, comprising:
a source electrode;
a drain electrode;
a channel region;
a plurality of protrusions; and
a carbon nanotube layer;
wherein:
the channel region is between the source electrode and the drain electrode;
the plurality of protrusions are at, and extend in a length direction of, the channel region; and
the carbon nanotube layer is formed over the plurality of protrusions after the plurality of protrusions are formed, and comprises a plurality of carbon nanotubes configured to have a direction of distribution substantially constrained by the plurality of protrusions.

2. The carbon nanotube thin film transistor of claim 1, wherein the plurality of carbon nanotubes in the carbon nanotube layer are in substantially a same direction as the length direction of the channel region.

3. The carbon nanotube thin film transistor of claim 2, wherein the plurality of protrusions are arranged in strips, aligning along a width direction of the channel region and with an interval between every two neighboring protrusions.

4. The carbon nanotube thin film transistor of claim 3, wherein each of the plurality of protrusions is cuboid.

5. The carbon nanotube thin film transistor of claim 4, wherein height of each of the plurality of protrusions is substantially same.

6. The carbon nanotube thin film transistor of claim 4, wherein height of each of the plurality of protrusions is ranged 10 nm-1000 nm.

7. The carbon nanotube thin film transistor of claim 3, wherein a first width of an interval between every two neighboring protrusions is substantially same.

8. The carbon nanotube thin file transistor of claim 7, wherein the first width is smaller than an average length of the plurality of carbon nanotubes in the carbon nanotube layer.

9. The carbon nanotube thin film transistor of claim 8, wherein the first width is ranged 5 nm-2000 nm.

10. The carbon nanotube thin film transistor of claim 3, wherein a second width of each of the plurality of protrusions is smaller than the average length of the plurality of carbon nanotubes in the carbon nanotube layer.

11. The carbon nanotube thin film transistor of claim 1, further comprising a gate electrode and a gate electrode insulating layer, wherein the gate electrode insulating layer is between the gate electrode and the carbon nanotube layer.

12. The carbon nanotube thin film transistor of claim 11, wherein the plurality of protrusions are disposed over, comprise a same material as, and form an integrated structure with, the gate electrode.

13. The carbon nanotube thin film transistor of claim 11, wherein the plurality of protrusions are disposed over, comprise a same material as, and form an integrated structure with, the gate electrode insulating layer.

14. A method for fabricating a carbon nanotube thin film transistor, comprising:
   providing a substrate;
   forming a gate electrode and a gate electrode insulating layer over the substrate; and
   forming a carbon nanotube layer, a pattern of a channel region, a source electrode, and a drain electrode;
   wherein:
      the channel region is between the source electrode and the drain electrode;
      a plurality of protrusions are arranged at the channel region, and extend in a length direction of the channel region; and
      the carbon nanotube layer comprises a plurality of carbon nanotubes, and is formed over the plurality of protrusions after the plurality of protrusions are formed, such that the plurality of carbon naotubes have a direction of distribution substantially constrained by the plurality of protrusions.

15. The method according to claim 14, wherein the forming a gate electrode and a gate electrode insulating layer over the substrate comprises:
   forming the gate electrode and the plurality of protrusions over the substrate, wherein the plurality of protrusions are disposed over, comprise a same material as, and form an integrated structure with, the gate electrode; and
   forming the gate electrode insulating layer over the gate electrode and the plurality of protrusions.

16. The method according to claim 14, wherein the forming a gate electrode and a gate electrode insulating layer over the substrate comprises:
   forming the gate electrode over the substrate; and
   forming the gate electrode insulating layer and the plurality of protrusions, wherein the plurality of protrusions are disposed over, comprise a same material as, and form an integrated structure with, the gate electrode insulating layer.

17. The method according to claim 14, wherein the forming a carbon nanotube layer, a pattern of a channel region, a source electrode, and a drain electrode comprises:
   forming the carbon nanotube layer and forming the pattern of the channel region; and
   forming the source electrode and the drain electrode.

18. The method according to claim 14, wherein the forming a carbon nanotube layer, a pattern of a channel region, a source electrode, and a drain electrode comprises:
   forming the source electrode and the drain electrode; and
   forming the carbon nanotube layer and forming the pattern of the channel region.

19. The method according to claim 14, wherein the plurality of protrusions are formed through coating and photolithographic etching.

20. The method according to claim 14, wherein the plurality of protrusions are formed through halftone etching, and the carbon nanotube layer is formed by depositing a carbon nanotube solution.

* * * * *